United States Patent
Lu et al.

(10) Patent No.: US 11,967,387 B2
(45) Date of Patent: *Apr. 23, 2024

(54) DETRAPPING ELECTRONS TO PREVENT QUICK CHARGE LOSS DURING PROGRAM VERIFY OPERATIONS IN A MEMORY DEVICE

(71) Applicant: Micron Technology, Inc., Boise, ID (US)

(72) Inventors: Ching-Huang Lu, Fremont, CA (US); Vinh Q. Diep, Hayward, CA (US); Zhengyi Zhang, San Jose, CA (US); Yingda Dong, Los Altos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/970,459

(22) Filed: Oct. 20, 2022

(65) Prior Publication Data

US 2023/0044240 A1 Feb. 9, 2023

Related U.S. Application Data

(63) Continuation of application No. 17/249,433, filed on Mar. 2, 2021, now Pat. No. 11,508,449.

(60) Provisional application No. 63/199,359, filed on Dec. 21, 2020.

(51) Int. Cl.
| | | |
|---|---|---|
| G11C 16/34 | (2006.01) | |
| G11C 16/08 | (2006.01) | |
| G11C 16/10 | (2006.01) | |
| G11C 16/30 | (2006.01) | |

(52) U.S. Cl.
CPC .......... *G11C 16/3459* (2013.01); *G11C 16/08* (2013.01); *G11C 16/10* (2013.01); *G11C 16/30* (2013.01)

(58) Field of Classification Search
CPC ..... G11C 16/3459; G11C 16/08; G11C 16/10; G11C 16/30; G11C 16/32; G11C 16/3418; G11C 29/04; G11C 8/08; G11C 2029/0407
See application file for complete search history.

(56) References Cited

U.S. PATENT DOCUMENTS

| | | | |
|---|---|---|---|
| 7,283,398 B1 | 10/2007 | He et al. | |
| 8,488,384 B2* | 7/2013 | Kim | G11C 11/5628 365/189.11 |
| 8,947,939 B2* | 2/2015 | Tsai | G11C 16/10 365/185.19 |
| 11,282,582 B2 | 3/2022 | Chen et al. | |
| 2011/0292725 A1 | 12/2011 | Choi et al. | |
| 2012/0081957 A1 | 4/2012 | Kim et al. | |

(Continued)

*Primary Examiner* — Sultana Begum
(74) *Attorney, Agent, or Firm* — Lowenstein Sandler LLP

(57) ABSTRACT

Processing logic in a memory device initiates a program operation on a memory array, the program operation comprising a program phase and a program verify phase. The processing logic further causes a negative voltage signal to be applied to a first selected word line of a block of the memory array during the program verify phase of the program operation, wherein the first selected word line is coupled to a corresponding first memory cell of a first plurality of memory cells in a string of memory cells in the block, wherein the first selected word line is associated with the program operation.

14 Claims, 9 Drawing Sheets

(56) References Cited

U.S. PATENT DOCUMENTS

2016/0307630 A1 10/2016 Choo et al.
2022/0020441 A1* 1/2022 Hwang ............... G11C 11/5671

* cited by examiner

DETRAPPING ELECTRONS TO PREVENT QUICK CHARGE LOSS DURING PROGRAM VERIFY OPERATIONS IN A MEMORY DEVICE

RELATED APPLICATIONS

This application is a continuation of U.S. patent application Ser. No. 17/249,433, filed Mar. 2, 2021, which claims the benefit of U.S. Provisional Patent Application No. 63/199,359, filed Dec. 21, 2020, the entire contents of each of which are hereby incorporated by reference herein.

TECHNICAL FIELD

Embodiments of the disclosure relate generally to memory sub-systems, and more specifically, relate to detrapping electrons to prevent quick charge loss during program verify operations in a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
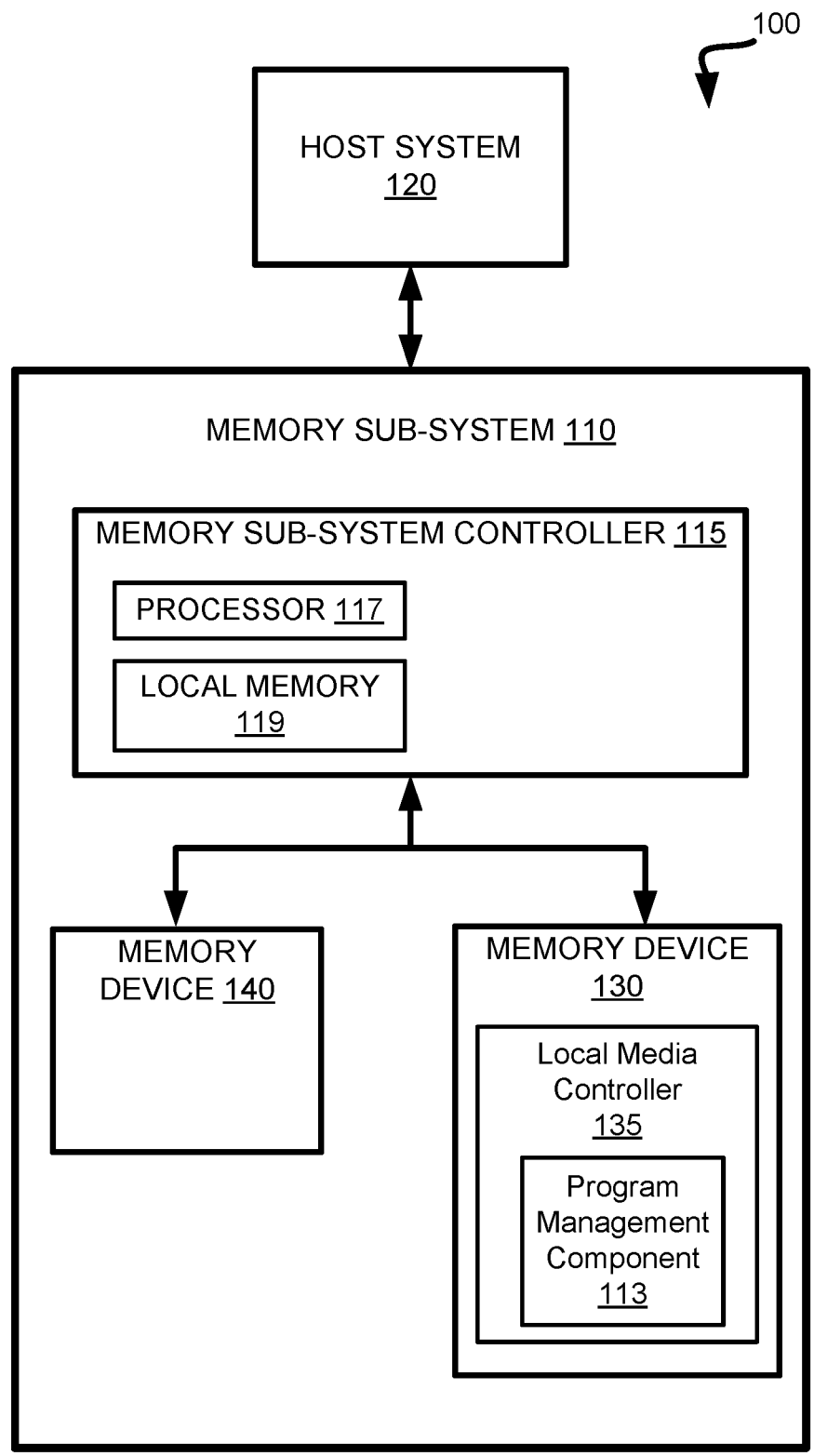
FIG. 1 illustrates an example computing system that includes a memory sub-system in accordance with some embodiments of the present disclosure.

Aspects of the present disclosure are directed to detrapping electrons to prevent quick charge loss during program verify operations in a memory device of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. A block hereinafter refers to a unit of the memory device used to store data and can include a group of memory cells, a word line group, a word line, or individual memory cells. Each block can include a number of sub-blocks, where each sub-block is defined by an associated pillar (e.g., a vertical conductive trace) extending from a shared bit line. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of poly-silicon channel material (i.e., a channel region). The memory cells can be coupled to access lines, which are commonly referred to as "word lines," often fabricated in common with the memory cells, so as to form an array of strings in a block of memory. The compact nature of certain non-volatile memory devices, such as 3D flash NAND memory, means word lines are common to many memory cells within a block of memory.

During a programming operation, a selected memory cell(s) can be programmed with the application of a programming voltage to a selected word line. In some cases, a series of incrementing voltage programming pulses are applied to the selected word line to increase a charge level, and thereby a threshold voltage, of each memory cell connected to that word line. After each programming pulse, or after a number of programming pulses, a program verify operation is performed to determine if the threshold voltage of the memory cell(s) has increased to a desired programming level. After the programming operation is complete, the programmed memory cell(s) can experience multiple forms of charge loss that can cause defects in the data retention characteristics of the memory cell(s), such as single bit charge loss, intrinsic charge loss, and quick charge loss. Quick charge loss (QLC) is the result of electrons trapped in a tunnel oxide layer, also referred to herein as a "band engineering (BE)" layer, after the application of a programming pulse moving back into the channel region of the string of memory cells. When a cell passes the program verify operation, the programmed threshold voltage appears to be higher due to the trapped charge in the tunnel oxide layer. When the memory cell is later read after the programming operation has been completed, however, the cell can have a threshold voltage that is lower than the threshold voltage obtained during the program verify operation due to the charge in the tunnel oxide layer leaking out to the channel region. This can require an enlargement of the threshold voltage distribution in order to accommodate all possible threshold voltages for a given state, and can lead to a higher error rate occurring during any subsequent read operation.

Certain memory devices attempt to mitigate quick charge loss through application of a negative gate bias voltage before the program verify operation. This voltage can detrap some of the electrons trapped in the tunnel oxide layer (i.e., allow those electrons to flow out into the channel region) so that some of the quick charge loss occurs before the sensing during the program verify operation. The application of the negative gate bias voltage, however, can also cause detrapping of electrons in the channel region itself. The detrapping in the channel region leads to changes in the threshold voltages of the memory cells in the string, thereby negatively impacting the read window budget (RWB) between voltage distributions of the memory cells and an increased read error rate. These devices do not separate the detrapping of electrons from the tunnel oxide layer and from the channel region so that they are not occurring at the same time either before or during the program verify operation.

Aspects of the present disclosure address the above and other deficiencies by detrapping electrons to prevent quick charge loss during program verify operations in a memory device. In one embodiment, processing logic in a memory device causes a negative voltage signal (e.g., −1 volt) to be applied to a selected word line (i.e., the word line being programmed (WLn)) of a block of a memory array of the memory device during a certain interval of a program verify phase of a programming operation to enhance detrapping of electrons from the tunnel oxide layer of the memory device. In one embodiment, the negative voltage signal is applied at the beginning of the program verify phase, such as before a positive pass voltage (i.e., Vpassr) is applied to the selected word line. Shortly after detrapping, the voltage signal applied to the selected word line, unselected word lines and a select gate device is ramped up to the pass voltage, which will not only discharge channel boosting due to the pass voltage ramping, but also cause electron trapping inside the poly-silicon channel region of the memory device. The magnitude of the pass voltage is generally not high enough to cause electron trapping in the tunnel oxide layer. In another embodiment, the negative voltage signal is applied at the end of the program verify phase, such as after the pass voltage and one or more verify voltages are applied to the selected word line. The negative voltage signal will detrap electrons from the tunnel oxide layer and from the channel region. During subsequent program operations, extra electron injection due to prior detrapping can program some electrons to a storage nitride layer rather than completely filling the tunnel oxide layer traps. Thus, at the end of the program operation, there are fewer electrons in the tunnel oxide layer traps, and since the negative voltage signal is not applied between the program phase and the program verify phase, the channel region traps remain filled.

Advantages of this approach include, but are not limited to, improved performance in the memory sub-system. In the manner described herein, the separation in time between the detrapping of electrons from the tunnel oxide layer and from the channel region increases the read window budget between voltage distributions in the memory array. This leads to a lower error rate during subsequently performed read operations, and improved reliability and data retention in the memory device. Accordingly, the overall quality of service level of the memory sub-system is improved.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAIVI), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, memory sub-system 110 includes a memory device program management component 113 that can oversee, control, and/or manage data access operations, such as program operations, performed on a non-volatile memory device, such as memory device 130, of memory sub-system 110. A program operation, for example, can include a number of phases, such as a program phase and a program verify phase. Program management component 113 is responsible for applying certain voltages (or indicating which voltages to apply) to memory device 130 during the program operation. For example, during the program phase, program management component 113 can cause a program voltage to be applied to a first selected word line (i.e., the word line being programmed (WLn)) of a block of a memory array of memory device 130 to program a corresponding first memory cell in a string of memory cells in the block to a target voltage (i.e., a voltage representing the data to be stored in the memory cell). During the program verify phase, program management component 113 can cause a program verify voltage to be applied to the first selected word line to sense the voltage level of the corresponding memory cell. In one embodiment, in order to enhance detrapping of electrons from a tunnel oxide layer of the memory device, during the program verify phase, program management component 113 can further cause a negative voltage signal to be applied to the first selected word line. Depending on the embodiment, the negative voltage signal can be applied either at a beginning of the program verify phase (i.e., before a positive pass voltage signal is applied to the first selected word line) or at an end of the program verify phase (i.e., after a positive pass voltage signal and one or more program verify voltage signals are applied to the selected word line). Further details with regards to the operations of the program management component 113 are described below.

Figure 2A:
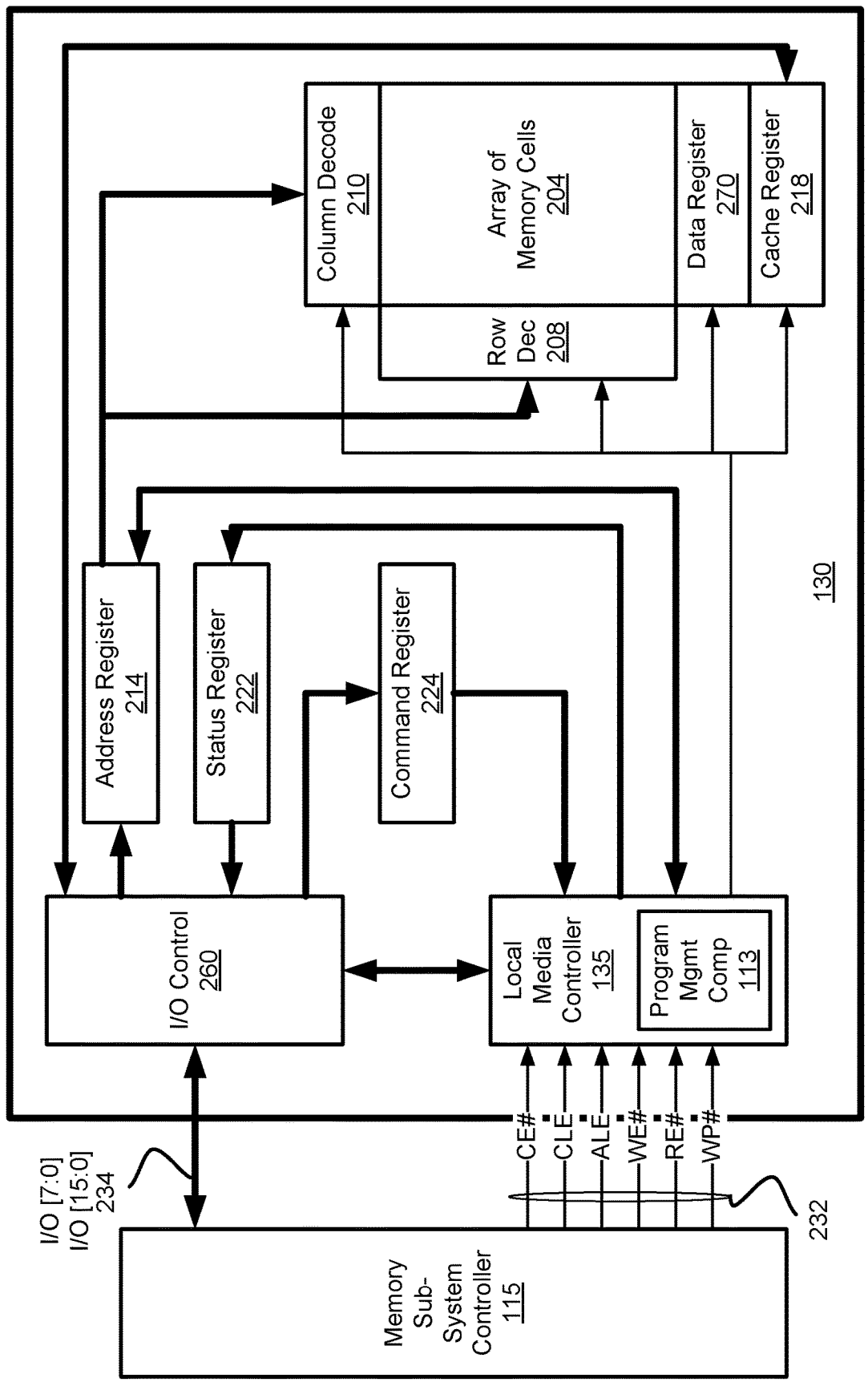
FIG. 2A is a block diagram of a memory device in communication with a memory sub-system controller of a memory sub-system, according to an embodiment.

FIG. 2A is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 204 logically arranged in rows and columns. Memory cells of a logical row are typically connected to the same access line (e.g., a word line) while memory cells of a logical column are typically selectively connected to the same data line (e.g., a bit line). A single access line may be associated with more than one logical row of memory cells and a single data line may be associated with more than one logical column. Memory cells (not shown in FIG. 2A) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 260 to manage input of commands, addresses and data to the memory device 130 as well as output of data and status information from the memory device 130. An address register 214 is in communication with I/O control circuitry 260 and row decode circuitry 208 and column decode circuitry 210 to latch the address signals prior to decoding. A command register 224 is in communication with I/O control circuitry 260 and local media controller 135 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses. In one embodiment, local media controller 134 includes program management component 113, which can implement the detrapping of electrons to prevent quick charge loss during program verify operations in memory device 130.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a program operation (e.g., write operation), data may be passed from the cache register 218 to the data register 270 for transfer to the array of memory cells 204; then new data may be latched in the cache register 218 from the I/O control circuitry 260. During a read operation, data may be passed from the cache register 218 to the I/O control circuitry 260 for output to the memory sub-system controller 115; then new data may be passed from the data register 270 to the cache register 218. The cache register 218 and/or the data register 270 may form (e.g., may form a portion of) a page buffer of the memory device 130. A page buffer may further include sensing devices (not shown in FIG. 2A) to sense a data state of a memory cell of the array of memory cells 204, e.g., by sensing a state of a data line connected to that memory cell. A status register 222 may be in communication with I/O control circuitry 260 and the local memory controller 135 to latch the status information for output to the memory sub-system controller 115.

Memory device 130 receives control signals at the memory sub-system controller 115 from the local media controller 135 over a control link 232. For example, the control signals can include a chip enable signal CE#, a command latch enable signal CLE, an address latch enable signal ALE, a write enable signal WE#, a read enable signal RE#, and a write protect signal WP#. Additional or alternative control signals (not shown) may be further received over control link 232 depending upon the nature of the memory device 130. In one embodiment, memory device 130 receives command signals (which represent commands), address signals (which represent addresses), and data signals (which represent data) from the memory subsystem controller 115 over a multiplexed input/output (I/O) bus 236 and outputs data to the memory sub-system controller 115 over I/O bus 236.

For example, the commands may be received over input/output (I/O) pins [7:0] of I/O bus 236 at I/O control circuitry 260 and may then be written into command register 224. The addresses may be received over input/output (I/O) pins [7:0] of I/O bus 236 at I/O control circuitry 260 and may then be written into address register 214. The data may be received over input/output (I/O) pins [7:0] for an 8-bit device or input/output (I/O) pins [15:0] for a 16-bit device at I/O control circuitry 260 and then may be written into cache register 218. The data may be subsequently written into data register 270 for programming the array of memory cells 204.

In an embodiment, cache register 218 may be omitted, and the data may be written directly into data register 270. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2A has been simplified. It should be recognized that the functionality of the various block components described with reference to FIG. 2A may not necessarily be segregated to distinct components or component portions of an integrated circuit device. For example, a single component or component portion of an integrated circuit device could be adapted to perform the functionality of more than one block component of FIG. 2A. Alternatively, one or more components or component portions of an integrated circuit device could be combined to perform the functionality of a single block component of FIG. 2A. Additionally, while specific I/O pins are described in accordance with popular conventions for receipt and output of the various signals, it is noted that other combinations or numbers of I/O pins (or other I/O node structures) may be used in the various embodiments.

Figure 2B:
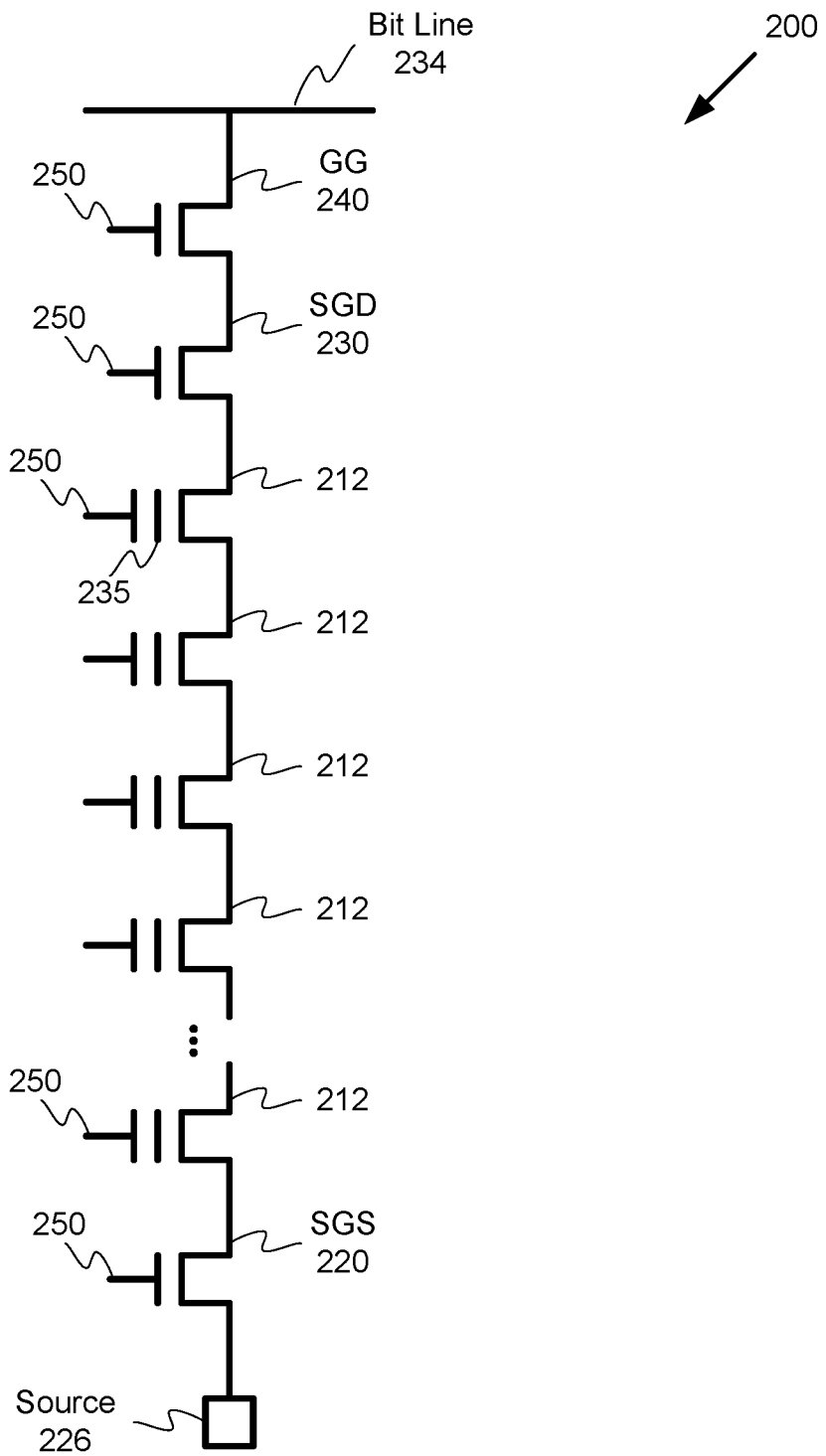
FIG. 2B is a schematic diagram illustrating a string of memory cells in a data block of a memory device in a memory sub-system in accordance with some embodiments of the present disclosure.

FIG. 2B is a schematic diagram illustrating a string 200 of memory cells in a data block of a memory device in a memory sub-system in accordance with some embodiments of the present disclosure. In one embodiment, the string 200 is representative of one portion of memory device 130, such as from array of memory cells 204, as shown in FIG. 2A. The string 200 includes a number of memory cells 212 (i.e., charge storage devices), such as up to 32 memory cells (or more) in some embodiments. The string 200 includes a source-side select transistor known as a source select gate 220 (SGS) (typically an n-channel transistor) coupled between a memory cell 212 at one end of the string 200 and a common source 226. The common source 226 may include, for example, a commonly doped semiconductor material and/or other conductive material. At the other end of the string 200, a drain-side select transistor called a drain select gate 230 (SGD) (typically an n-channel transistor) and a gate induced drain leakage (GIDL) generator 240 (GG) (typically an n-channel transistor) are coupled between one of the memory cells 212 and a data line 234, which is commonly referred to in the art as a "bit line." The common source 226 can be coupled to a reference voltage (e.g., ground voltage or simply "ground" [Gnd]) or a voltage source (e.g., a charge pump circuit or power supply which may be selectively configured to a particular voltage suitable for optimizing a programming operation, for example).

Each memory cell 212 may include, for example, a floating gate transistor or a charge trap transistor and may comprise a single level memory cell or a multilevel memory cell. The floating gate may be referred to as a charge storage structure 235. The memory cells 212, the source select gate 220, the drain select gate 230, and the GIDL generator 240 can be controlled by signals on their respective control gates 250.

The control signals can be applied by program management component 113, or at the direction of program management component 113, to select lines (not shown) to select strings, or to access lines (not shown) to select memory cells 212, for example. In some cases, the control gates can form a portion of the select lines (for select devices) or access lines (for cells). The drain select gate 230 receives a voltage that can cause the drain select gate 230 to select or deselect the string 200. In one embodiment, each respective control gate 250 is connected to a separate word line (i.e., access line), such that each device or memory cell can be separately controlled.

In one embodiment, in order to enhance detrapping of electrons from a tunnel oxide layer that forms part of string 200, during the program verify phase of a program operation, program management component 113 can cause a negative voltage signal to be applied to the first selected word line, which is received at the corresponding control gate 250 to which the first selected word line is connected. Depending on the embodiment, the negative voltage signal can be applied either at a beginning of the program verify phase (i.e., before a positive pass voltage signal is applied to the first selected word line) or at an end of the program verify phase (i.e., after a positive pass voltage signal and one or more program verify voltage signals are applied to the selected word line). The application of this negative voltage signal can enhance detrapping of electrons from the tunnel oxide layer during the program verify phase without causing detrapping of electrons in the poly-silicon channel region of string 200. The specific application of the negative voltage signal can vary depending on whether a single pass or multi-pass program operation is being performed, as is described in more detail below.

Figure 3:
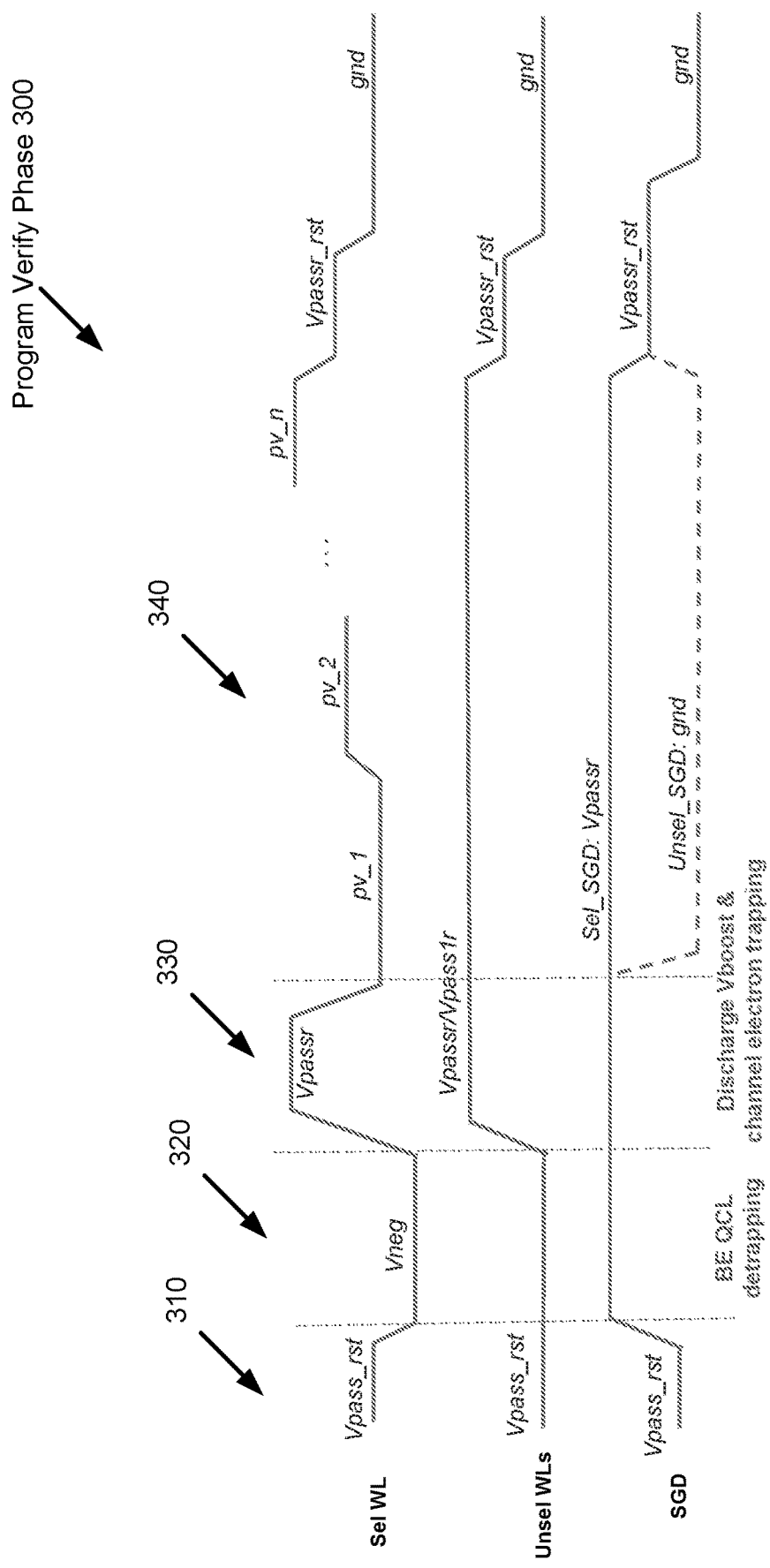
FIG. 3 is a timing diagram for operation of a memory device with negative word line biasing at the beginning of a program verify phase of a single pass program operation, in accordance with some embodiments of the present disclosure.

FIG. 3 is a timing diagram 300 for operation of a memory device with negative word line biasing at the beginning of a program verify phase of a single pass program operation, in accordance with some embodiments of the present disclosure. During a programming operation performed on a non-volatile memory device, such as memory device 130, certain phases can be encountered, including a program phase and a program verify phase. During the program phase, a program voltage is applied to selected word lines of the memory device 130, in order to program a certain level of charge to the selected memory cells on the word lines representative of a desired value. During the program verify phase, a read voltage is applied to the selected word lines to read the level of charge stored at the selected memory cells to confirm that the desired value was properly programmed. Since relatively high voltages are applied during the program and program verify operations, program recovery and program verify recovery phases can be implemented to allow the memory device 130 to recover.

Timing diagram 300 illustrates the program verify phase, according to one embodiment. In this embodiment, the program verify phase includes four time intervals, during which different voltage signals are applied to various devices in memory device 130. During a first time interval 310, a reset pass voltage (i.e., Vpass_rst) is applied to all data word lines, including the selected word line (Sel WL) and any unselected word lines (Unsel WLs) as well as a drain select gate (SGD) of the string 200. During a second time interval 320, program management component 113 causes a negative voltage signal (Vneg) to be applied to the selected word line (Sel WL). In one embodiment, program management component 113 sends a signal to the word line driver (or some other component) instructing that driver to apply the negative voltage signal to the word line. The voltage signal(s) applied to the unselected word lines remain at the reset pass voltage and a select gate pass voltage (Vpassr) is applied to the drain select gate. The negative voltage signal will enhance detrapping in the tunnel oxide layer and the channel region of memory string 200. After a certain period of time (e.g., several microseconds), a third time interval 330 can begin. During the third time interval 330, a pass voltage (Vpassr) spike is applied to the selected word line and the voltage signal on the unselected word lines is ramped up to the pass voltage (Vpassr/Vpass1r). The pass voltage can discharge channel boosting and also cause electron trapping in the poly-silicon channel region. During a fourth time interval 340, one or more program verify voltage signals (pv_1, pv_2, . . . pv_n) are applied to the selected word line. These voltages sense the level of charge stored at the selected memory cells to confirm that the desired value was properly programmed. Since electron detrapping of the tunnel oxide layer was already performed during second time interval 320, the shallow traps of the tunnel oxide layer will be empty and will not impact the sensing of program verify operation performed during the fourth time interval 340. The voltage signals applied to the unselected word lines and drain select gate can remain at the pass voltage, or optionally ramp down to a ground voltage (gnd), and all voltage signals are eventually ramped down to the reset pass voltage (Vpassr_rst) and ground at the end of the program verify phase 300.

Figure 4A:
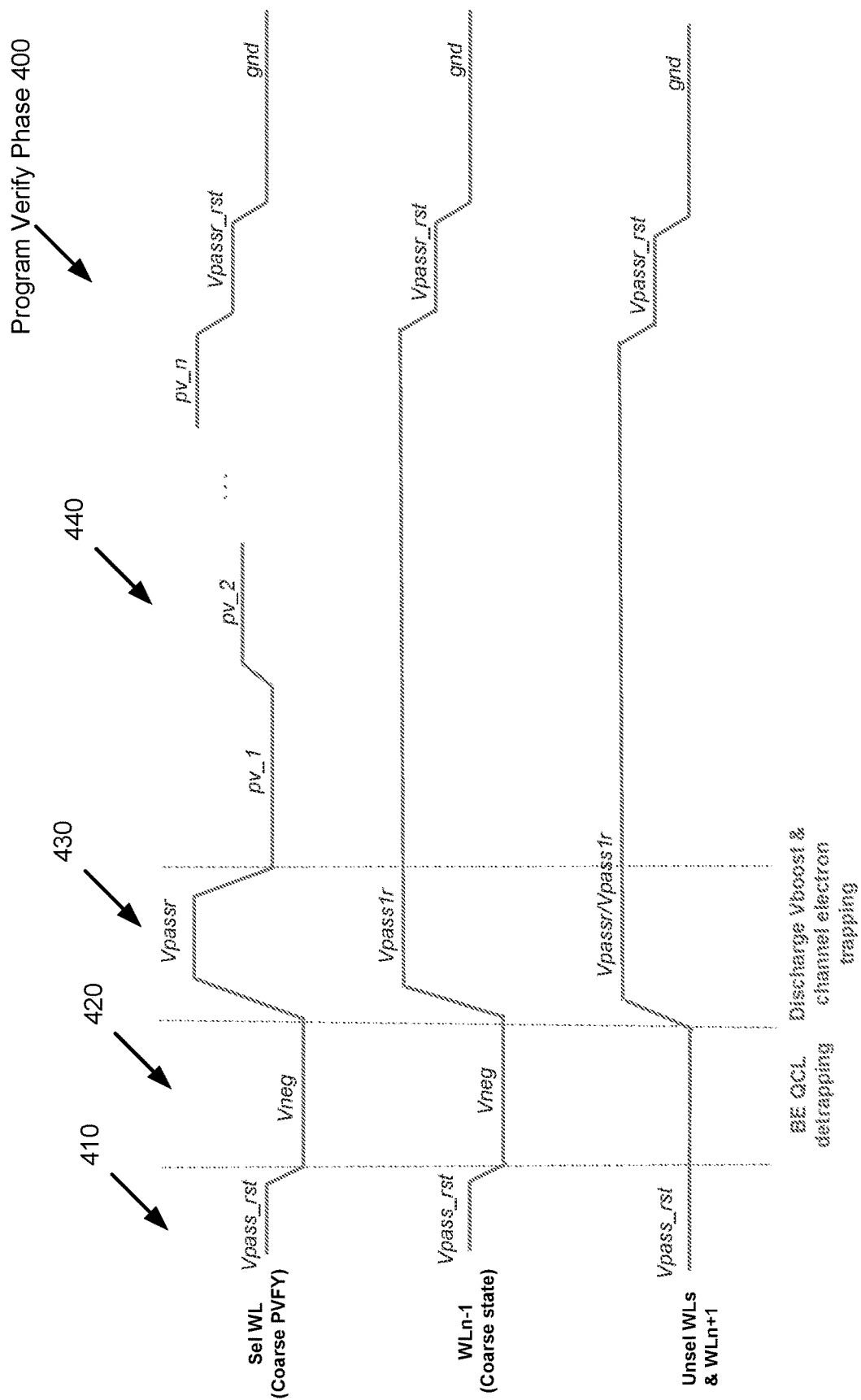
FIG. 4A is a timing diagram for operation of a memory device with negative word line biasing at the beginning of a program verify phase of a first pass of a multi-pass program operation, in accordance with some embodiments of the present disclosure.

FIG. 4A is a timing diagram 400 for operation of a memory device with negative word line biasing at the beginning of a program verify phase of a first pass of a multi-pass program operation, in accordance with some embodiments of the present disclosure. Certain memory sub-systems, such as those implementing QLC memory, use a multi-pass programming algorithm, such as a coarse-fine, two pass programing algorithm. In such an embodiment, programming a word line begins by coarsely the memory cells a first pass. The objective of this "coarse," first pass is to program all cells rapidly to slightly below their final target programming levels. During the slower, "fine," second pass, the memory cells are programmed to a slightly higher final target programmed voltage. Such two-pass programming minimizes cell to cell (C2C) interference, as every cell and its neighbors are nearly at their final target programmed voltage when the fine programming pass is performed, and need only be "touched-up." The combination of not requiring precision programming in the first pass, and the minimized C2C coupling, leads to fast programming with high RWB.

Timing diagram 400 illustrates the program verify phase after a first programming pass, according to one embodiment. In this embodiment, the program verify phase includes four time intervals, during which different voltage signals are applied to various devices in memory device 130. During a first time interval 410, a reset pass voltage (i.e., Vpass_rst) is applied to all data word lines of the string 200. During a second time interval 420, program management component 113 causes a negative voltage signal (Vneg) to be applied to the selected word line (Sel WL) and to a second word line (WLn−1) adjacent to the selected word line on one side of the selected word line. The second word line can be a word line connected to a memory cell that has previously been coarsely programmed. In one embodiment, program management component 113 sends a signal to the word line driver(s) (or some other component) instructing that driver to apply the negative voltage signal to the word line(s). The voltage signal(s) applied to the unselected word lines remain at the reset pass voltage and a select gate pass voltage (Vpassr) is applied to the drain select gate. The negative voltage signals will enhance detrapping in the tunnel oxide layer and the channel region of memory string 200. After a certain period of time (e.g., several microseconds), a third time interval 430 can begin. During the third time interval 430, a pass voltage (Vpassr) spike is applied to the selected word line and select gate and the voltage signals on the second word line (WLn−1) and any unselected word lines, including a third word line (WLn+1) adjacent to the selected word line on a second side of the selected word line, are ramped up to the pass voltage (Vpassr/Vpass1r). The pass voltage on select gate can discharge channel boosting and the pass voltage on selected word line can cause electron trapping in the poly-silicon channel region. During a fourth time interval 440, one or more program verify voltage signals (pv_1, pv_2, . . . pv_n) are applied to the selected word line. These voltages sense the level of charge stored at the selected memory cells to confirm that the desired value was properly programmed. Since electron detrapping of the tunnel oxide layer was already performed during second time interval 420, the shallow traps of the tunnel oxide layer will be empty and will not impact the sensing of program verify operation performed during the fourth time interval 440. The voltage signals applied to the second word line and the unselected word lines can remain at the pass voltage, and all voltage signals are eventually ramped down to the reset pass voltage (Vpassr_rst) and a ground voltage (gnd) at the end of the program verify phase 400.

Figure 4B:
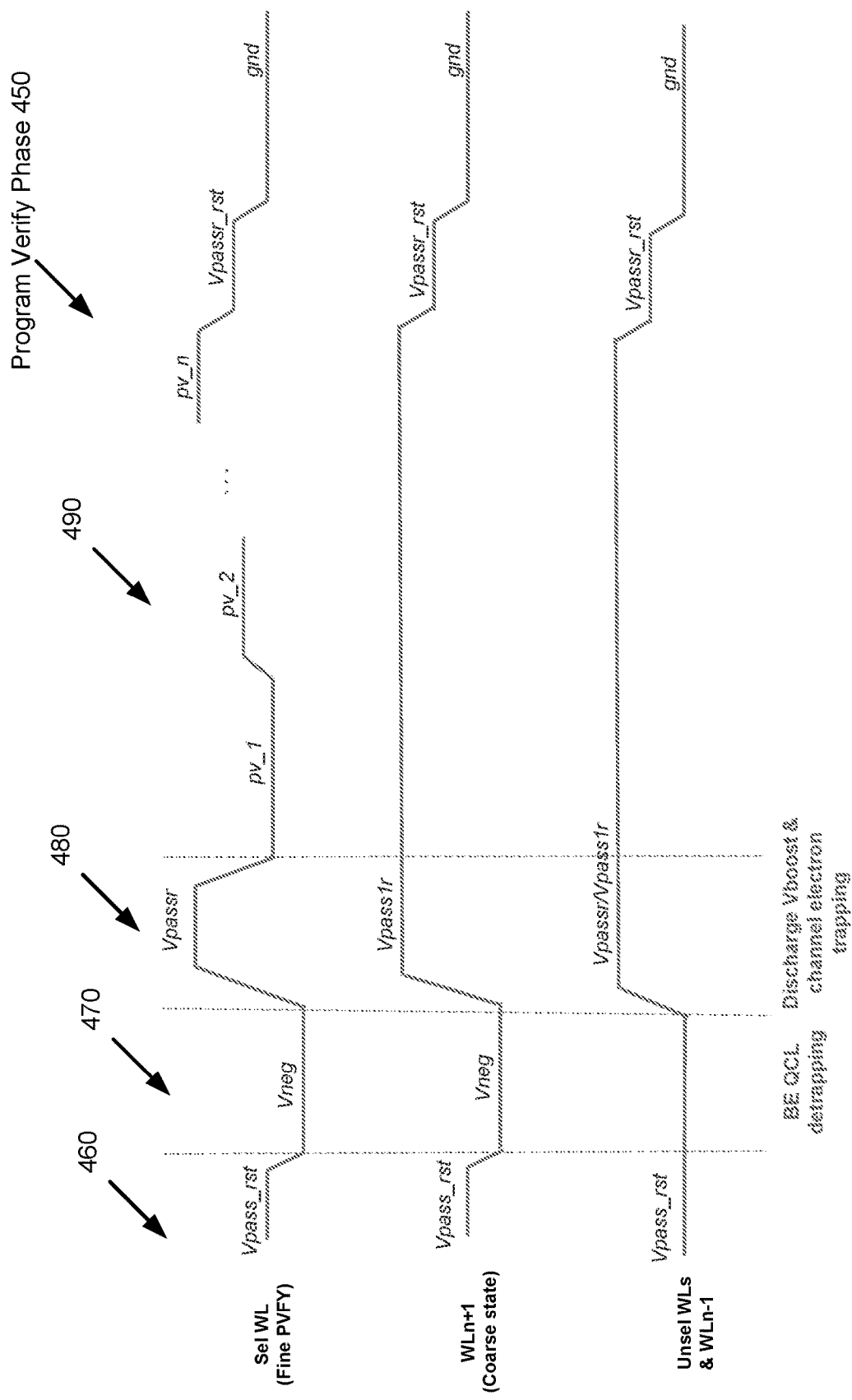
FIG. 4B is a timing diagram for operation of a memory device with negative word line biasing at the beginning of a program verify phase of a second pass of a multi-pass program operation, in accordance with some embodiments of the present disclosure.

FIG. 4B is a timing diagram 450 for operation of a memory device with negative word line biasing at the beginning of a program verify recovery phase of a second pass of a multi-pass program operation, in accordance with some embodiments of the present disclosure. Timing diagram 450 illustrates the program verify phase after a second programming pass, according to one embodiment. In this embodiment, the program verify phase includes four time intervals, during which different voltage signals are applied to various devices in memory device 130. During a first time interval 460, a reset pass voltage (i.e., Vpass_rst) is applied to all data word lines of the string 200. During a second time interval 470, program management component 113 causes a negative voltage signal (Vneg) to be applied to the selected word line (Sel WL) and to a third word line (WLn+1) adjacent to the selected word line on a second side of the selected word line. The third word line can be a word line connected to a memory cell that has previously been coarsely programmed, but has not yet been finely programmed. In one embodiment, program management component 113 sends a signal to the word line driver(s) (or some other component) instructing that driver to apply the negative voltage signal to the word line(s). The voltage signal(s) applied to the unselected word lines remain at the reset pass voltage and a select gate pass voltage (Vpassr) is applied to the drain select gate. The negative voltage signals will enhance detrapping in the tunnel oxide layer and the channel region of memory string 200. After a certain period of time (e.g., several microseconds), a third time interval 480 can begin. During the third time interval 480, a pass voltage (Vpassr) spike is applied to the selected word line and selected gate and the voltage signals on the third word line (WLn+1) and any unselected word lines, including the second word line (WLn−1), are ramped up to the pass voltage (Vpassr/Vpass1r). The pass voltage on select gate can discharge channel boosting and the pass voltage on selected word line can cause electron trapping in the poly-silicon channel region. During a fourth time interval 490, one or more program verify voltage signals (pv_1, pv_2, . . . pv_n) are applied to the selected word line. These voltages sense the level of charge stored at the selected memory cells to confirm that the desired value was properly programmed. Since electron detrapping of the tunnel oxide layer was already performed during second time interval 470, the shallow traps of the tunnel oxide layer will be empty and will not impact the sensing of program verify operation performed during the fourth time interval 490. The voltage signals applied to the third word line and the unselected word lines can remain at the pass voltage, and all voltage signals are eventually ramped down to the reset pass voltage (Vpassr_rst) and a ground voltage (gnd) at the end of the program verify phase 450.

Figure 5:
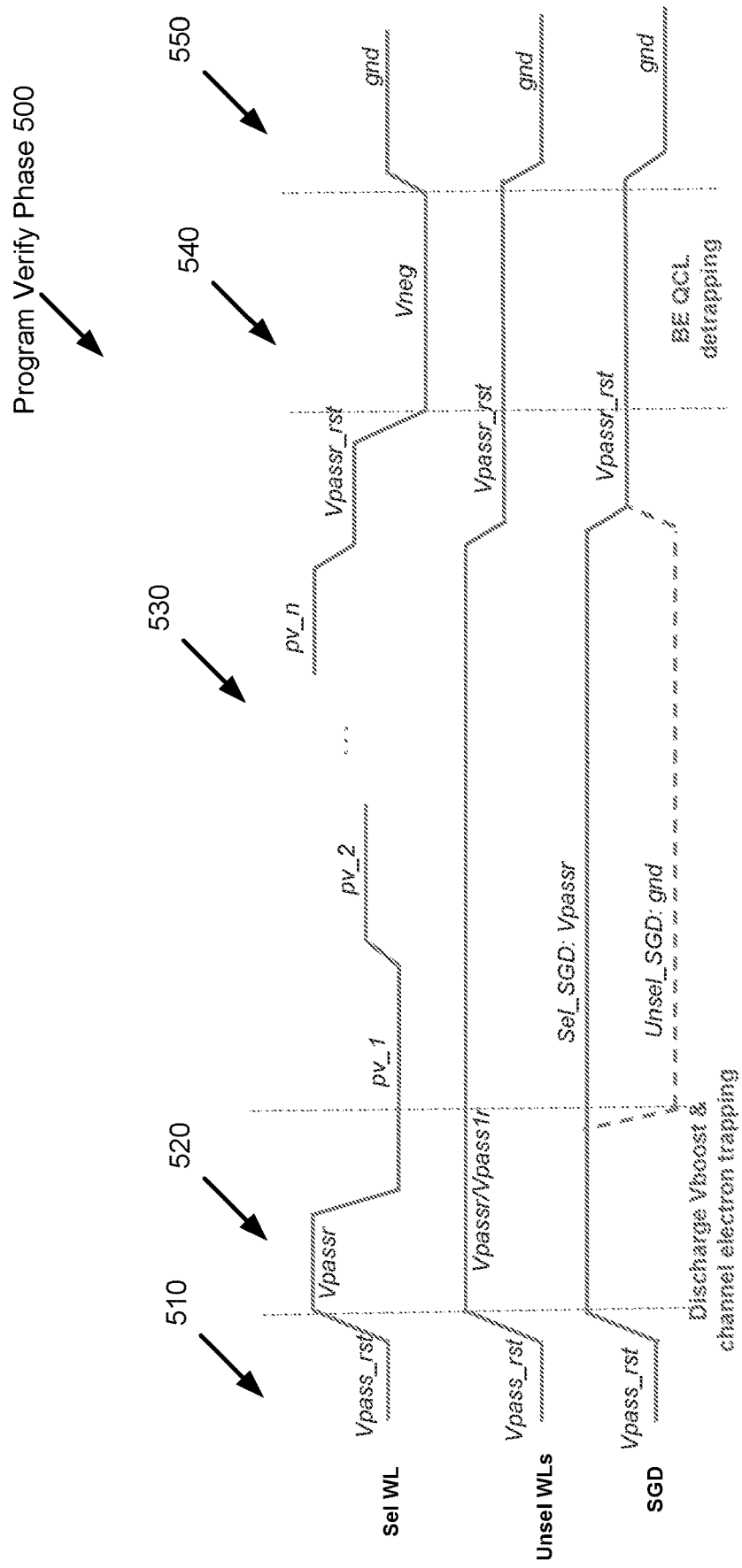
FIG. 5 is a timing diagram for operation of a memory device with negative word line biasing at the end of a program verify phase of a single pass program operation, in accordance with some embodiments of the present disclosure.

FIG. 5 is a timing diagram 500 for operation of a memory device with negative word line biasing at the end of a program verify phase of a single pass program operation, in accordance with some embodiments of the present disclosure. In this embodiment, the program verify phase includes five time intervals, during which different voltage signals are applied to various devices in memory device 130. During a first time interval 510, a reset pass voltage (i.e., Vpass_rst) is applied to all data word lines, including the selected word line (Sel WL) and any unselected word lines (Unsel WLs) as well as a drain select gate (SGD) of the string 200. During the second time interval 520, a pass voltage (Vpassr) spike is applied to the selected word line and select gate and the voltage signal on the unselected word lines and drain select gate is ramped up to the pass voltage (Vpassr/Vpass1r). The pass voltage on select gate can discharge channel boosting and the pass voltage on selected word line can cause electron trapping in the poly-silicon channel region. During a third time interval 530, one or more program verify voltage signals (pv_1, pv_2, . . . pv_n) are applied to the selected word line. These voltages sense the level of charge stored at the selected memory cells to confirm that the desired value was properly programmed. The voltage signals applied to the unselected word lines and drain select gate can remain at the pass voltage, or optionally ramp down to a ground voltage (gnd), and all voltage signals are eventually ramped down to the reset pass voltage (Vpassr_rst). During a fourth time interval 540, program management component 113 causes a negative voltage signal (Vneg) to be applied to the selected word line (Sel WL). In one embodiment, program management component 113 sends a signal to the word line driver (or some other component) instructing that driver to apply the negative voltage signal to the word line. The voltage signal(s) applied to the unselected word lines and the drain select gate remain at the reset pass voltage. The negative voltage signal will detrap electrons in the tunnel oxide layer and the channel region of memory string 200. After a certain period of time (e.g., several microseconds), a fifth time interval 550 can begin. During the fifth time interval 550, all voltage signals are ramped down to the ground at the end of the program verify recovery phase 500. During subsequent program operations, extra electron injection due to prior detrapping can program some electrons to a storage nitride layer rather than completely filling the tunnel oxide layer traps. Thus, at the end of the program operation, there are fewer electrons in the tunnel oxide layer traps, and since the negative voltage signal is not applied between the program phase and the program verify phase, the channel region traps remain filled.

In another embodiment, program management component 113 can cause the negative voltage signal to be applied at the end of a program verify phase of a multi-pass program operation. For example, program management component 113 can cause the negative voltage signal to be applied to the selected word line, as well as to one or more adjacent word lines, after a pass voltage (e.g., Vpassr) and one or more program verify voltages (e.g., pv_1-pv_n) have been applied. In one embodiment, the negative voltage signal is applied to the selected word line and to a second word line (e.g., WLn−1) adjacent to the selected word line on one side of the selected word line during a first programming pass of the multi-pass program operation. Then, during a second pass of the multi-pass program operation, the negative voltage signal is applied to the selected word line and to a third word line (e.g., WLn+1) adjacent to the selected word line on the other side of the selected word line. The application of this negative voltage signal can detrap electrons in the tunnel oxide layer and the channel region of memory string, so that such electrons will not impact subsequent read operation performed on the memory cells of the memory string.

Figure 6:
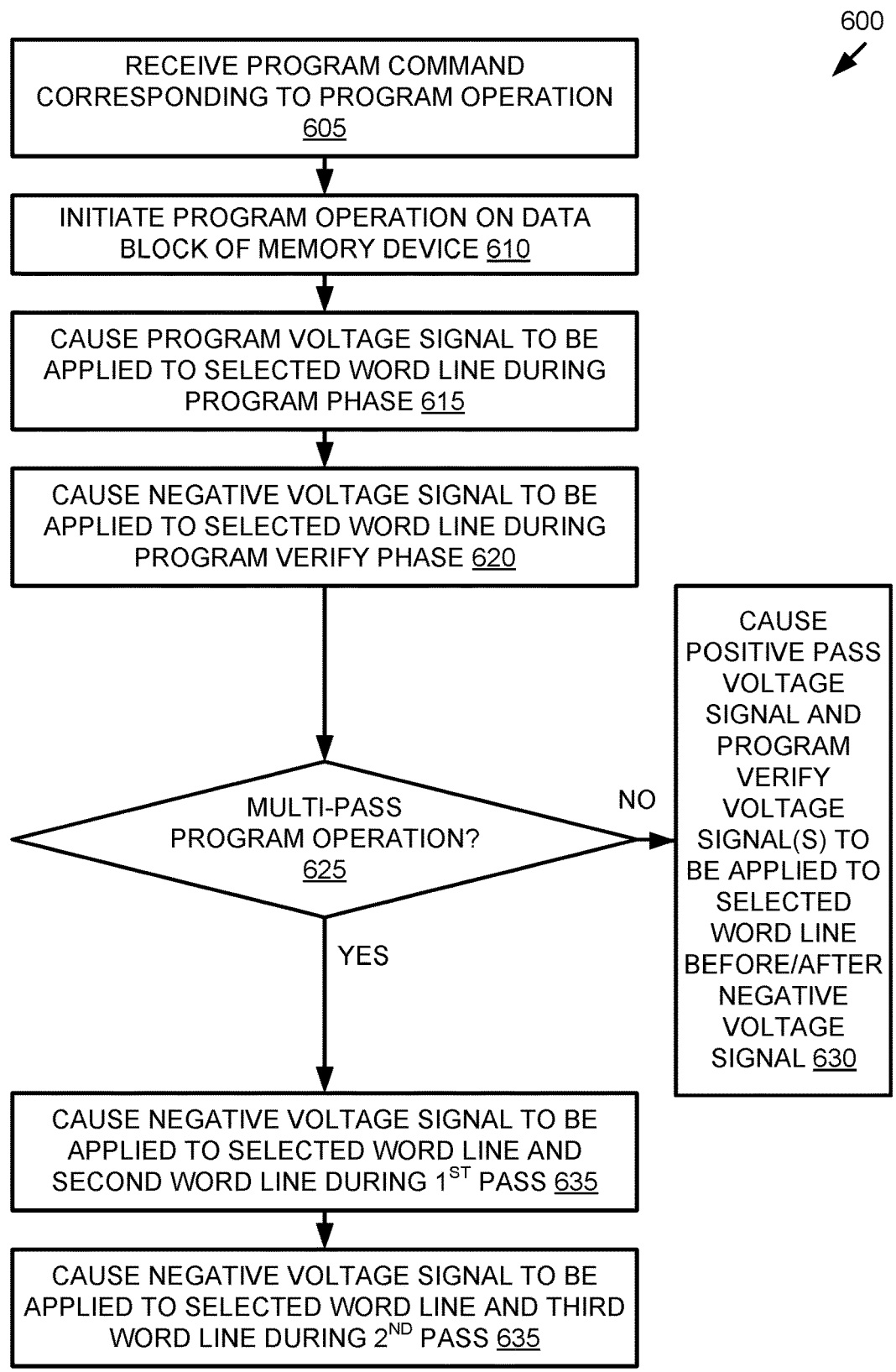
FIG. 6 is a flow diagram of an example method of detrapping electrons to prevent quick charge loss during program verify operations in a memory device, in accordance with some embodiments of the present disclosure.

FIG. 6 is a flow diagram of an example method of detrapping electrons to prevent quick charge loss during program verify operations in a memory device, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by program management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 605, a command is received. For example, processing logic (e.g., program management component 113) can receive, from a requestor, such as memory subsystem controller 115, a command to perform a memory access operation on a memory array, such as memory array 204, of a memory device, such as memory device 130. In one embodiment, the command comprises a program command and the memory access operation comprises a program operation. For example, the memory access operation can include a QLC program operation associated with a plurality of pages (e.g., four pages) of host data to be written to the memory device.

At operation 610, a memory access operation is initiated. For example, the processing logic can initiates a program operation associated with the received command on memory device 130. In one embodiment, the program operation includes a program phase and a program verify phase. In certain embodiments, each of these phases can be repeated numerous times in a cycle during a single programming operation.

At operation 615, a program voltage signal is applied. For example, the processing logic can cause a program voltage signal to be applied to a first selected word line of a block of the memory array during a program phase of the program operation. The program voltage signal is applied to selected word lines of the memory device 130, in order to program a certain level of charge (i.e., a target voltage) to the selected memory cells in a string of memory cells on the word lines representative of a desired value.

At operation 620, a negative voltage signal is applied. For example, the processing logic can cause a negative voltage signal to be applied to the first selected word line during the program verify phase of the program operation. In one embodiment, the first selected word line is coupled to a corresponding first memory cell of a first plurality of memory cells in a string of memory cells in the block and the first selected word line is associated with the program operation (i.e., is connected to the memory cell(s) being programmed).

At operation 625, a determination is made. For example, the processing logic can determine whether the program operation includes a multi-pass program operation. In one embodiment, the program operation is a single pass program operation where the memory cells connected to the selected word line are programmed in a single programming pass. In other embodiments, the program operation is a multi-pass program operation, where the memory cells of the memory array are programmed in two or more programming passes. In one embodiment, during a first pass of the multi-pass programing operations, the processing logic coarsely programs memory cells to initial values representing the pages of host data. In one embodiment, program management component 113 can cause one or more programming pulses to be applied to the selected word line to store the pages of the host data in the memory cells. The initial values can be slightly below final target values so that the first programming pass can be performed with minimal latency. In one embodiment, during the second pass of the multi-pass programing operation, the processing logic reads the coarsely programmed initial values from the first pass and finely programs the memory cells to final values representing the pages of host data. In one embodiment, program management component 113 can cause one or more programming voltage pulses to be applied to the memory cells to increase the initial values to the final values representing the pages of host data.

If the program operation is not a multi-pass operation (i.e., the program operation is a single pass program operation), at operation 630, additional voltage signals are applied. Depending on the embodiment, a positive pass voltage signal (e.g., Vpassr) and one or more program verify voltage signals (e.g., pv_1-pv_n) are applied either before or after the negative voltage signal during the program verify phase. In one embodiment, the processing logic causes the negative voltage signal to be applied to the first selected word line at the beginning of the program verify phase of the program operation (i.e., before the positive pass voltage signal is applied to the first selected word line). In another embodiment, the processing logic causes the negative voltage signal to be applied to the selected word line at the end of the program verify phase of the program operation (i.e., after the positive pass voltage signal and one or more program verify voltage signals are applied to the selected word line).

If the program operation is a multi-pass operation, at operation 635, the negative voltage signal is applied during a first programming pass. For example, the processing logic can cause the negative voltage signal to be applied to the first selected word line (e.g., WLn) and to a second word line (e.g., WLn−1) adjacent to the first selected word line during a first program verify phase of a plurality of program verify phases. The second word line is coupled to a second memory cell of a plurality of memory cells on a first side of the first memory cell in the string of memory cells.

At operation 640, the negative voltage signal is applied during a second programming pass. For example, the processing logic can cause the negative voltage signal to be applied to the first selected word line (e.g., WLn) and to a third word line (e.g., WLn+1) adjacent to the first selected word line during a second program verify phase of the plurality of program verify phases. The third word line is coupled to a third memory cell of the plurality of memory cells on a second side of the first memory cell in the string of memory cells.

Figure 7:
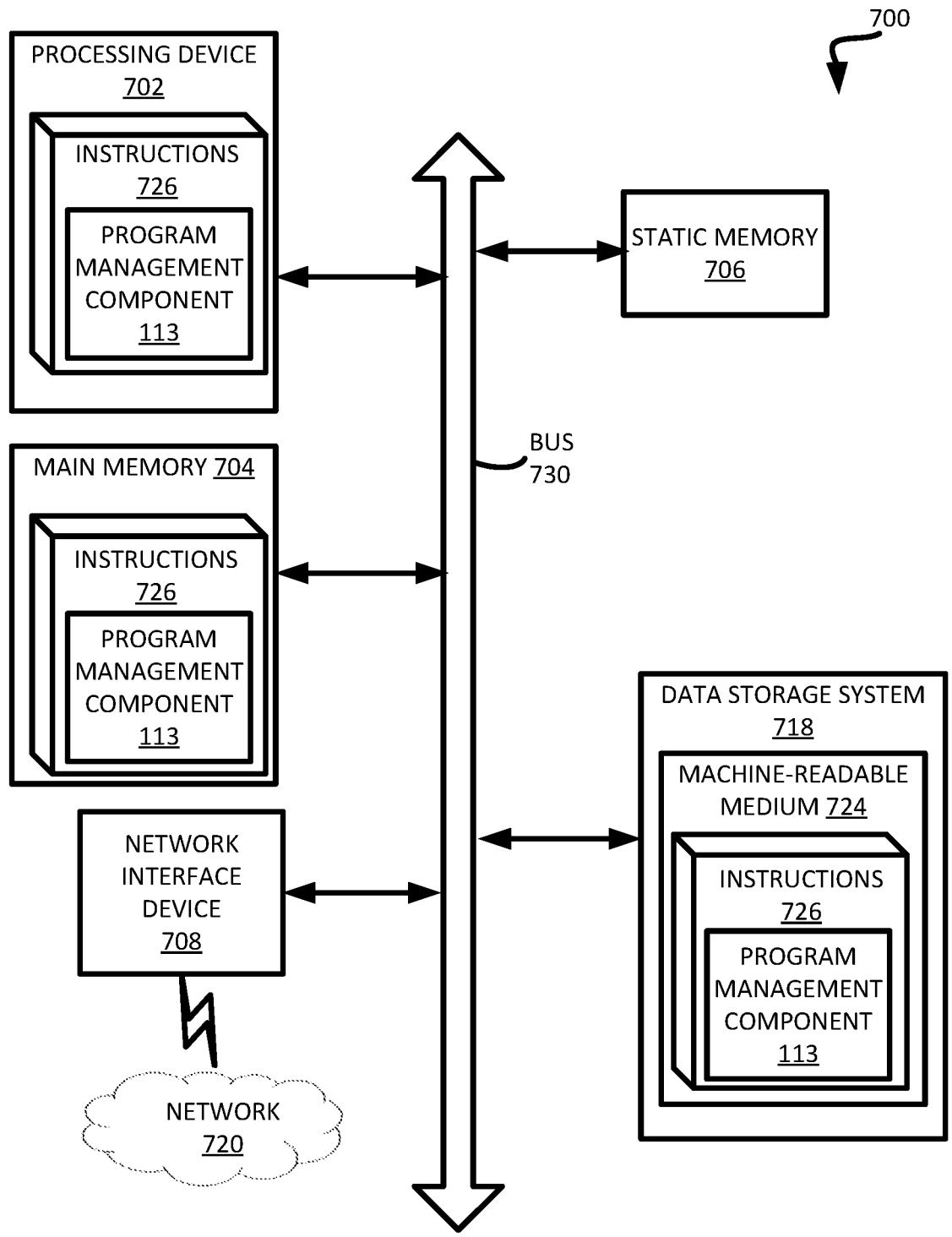
FIG. 7 is a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the program management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to the program management component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array; and
control logic, operatively coupled with the memory array, to perform operations comprising:
initiating a multi-pass program operation on the memory array, the multi-pass program operation comprising a plurality of program phases and a plurality of program verify phases; and
causing a negative voltage signal to be applied to a first selected word line of a block of the memory array and to a second word line adjacent to the first selected word line during a first program verify phase of the plurality of program verify phases, wherein the first selected word line is coupled to a corresponding first memory cell of a first plurality of memory cells in a string of memory cells in the block, wherein the first selected word line is associated with the multi-pass program operation.

2. The memory device of claim 1, wherein the negative voltage signal is applied to the first selected word line before a positive pass voltage signal is applied to the first selected word line during the first program verify phase of the plurality of program verify phases.

3. The memory device of claim 1, wherein the second word line is coupled to a second memory cell of the first plurality of memory cells on a first side of the first memory cell in the string of memory cells.

4. The memory device of claim 3, wherein the control logic to perform operations further comprising:
   causing the negative voltage signal to be applied to the first selected word line and to a third word line adjacent to the first selected word line during a second program verify phase of the plurality of program verify phases.

5. The memory device of claim 4, wherein the third word line is coupled to a third memory cell of the first plurality of memory cells on a second side of the first memory cell in the string of memory cells.

6. The memory device of claim 1, wherein the negative voltage signal is applied to the selected word line after a positive pass voltage signal and one or more program verify voltage signals are applied to the selected word line during the first program verify phase of the plurality of program verify phases.

7. The memory device of claim 1, wherein each of the plurality of program phases and the plurality of program verify phases are associated with different programming voltages, and wherein the negative voltage is applied to the first selected word line only during a subset of the plurality of program verify phases associated with programming voltages that exceed a predefined threshold voltage level.

8. A method comprising:
   initiating a multi-pass program operation on a memory array of a memory device, the multi-pass program operation comprising a plurality of program phases and a plurality of program verify phases; and
   causing a negative voltage signal to be applied to a first selected word line of a block of the memory array and to a second word line adjacent to the first selected word line during a first program verify phase of the plurality of program verify phases, wherein the first selected word line is coupled to a corresponding first memory cell of a first plurality of memory cells in a string of memory cells in the block, wherein the first selected word line is associated with the multi-pass program operation.

9. The method of claim 8, wherein the negative voltage signal is applied to the first selected word line before a positive pass voltage signal is applied to the first selected word line during the first program verify phase of the plurality of program verify phases.

10. The method of claim 8, wherein the second word line is coupled to a second memory cell of the first plurality of memory cells on a first side of the first memory cell in the string of memory cells.

11. The method of claim 10, further comprising:
   causing the negative voltage signal to be applied to the first selected word line and to a third word line adjacent to the first selected word line during a second program verify phase of the plurality of program verify phases.

12. The method of claim 11, wherein the third word line is coupled to a third memory cell of the first plurality of memory cells on a second side of the first memory cell in the string of memory cells.

13. The method of claim 8, wherein the negative voltage signal is applied to the selected word line after a positive pass voltage signal and one or more program verify voltage signals are applied to the selected word line during the first program verify phase of the plurality of program verify phases.

14. The method of claim 8, wherein each of the plurality of program phases and the plurality of program verify phases are associated with different programming voltages, and wherein the negative voltage is applied to the first selected word line only during a subset of the plurality of program verify phases associated with programming voltages that exceed a predefined threshold voltage level.

* * * * *